(12) United States Patent
Shindo (10) Patent No.: US 6,815,301 B2
(45) Date of Patent: Nov. 9, 2004

(54) METHOD FOR FABRICATING BIPOLAR TRANSISTOR

(75) Inventor: Masao Shindo, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/781,642

(22) Filed: Feb. 20, 2004

(65) Prior Publication Data

US 2004/0192005 A1 Sep. 30, 2004

(30) Foreign Application Priority Data

Mar. 24, 2003 (JP) ........................................ 2003-080878

(51) Int. Cl.[7] .............................................. H01L 21/331
(52) U.S. Cl. ........................ 438/309; 438/338; 438/373
(58) Field of Search .................................. 438/309–377

(56) References Cited

U.S. PATENT DOCUMENTS 5,488,003 A * 1/1996 Chambers et al. .......... 438/309
5,856,003 A   1/1999 Chiu

FOREIGN PATENT DOCUMENTS

JP          59-50227        12/1984
JP          P2001-291781 A  10/2001

OTHER PUBLICATIONS

Don H. Lee, et al., "Ion–Implanted Semiconductor Devices", Proceedings of the IEEE, pp. 1241–1255, Sep. 1974.

* cited by examiner

Primary Examiner—H. Jey Tsai
(74) Attorney, Agent, or Firm—McDermott Will & Emery LLP (57) ABSTRACT

A method for fabricating a bipolar transistor includes: a first step of implanting, along the normal direction of the principle surface of a first-conductive-type semiconductor single crystalline substrates ions of a second-conductive-type first impurity into the semiconductor single crystalline substrate to form a second-conductive-type collector layer; a second step of implanting, along the direction tilted from the normal direction, ions of a second-conductive-type second impurity into the semiconductor single crystalline substrate at a higher injection energy than that in the ion implantation of the first step to form a buried collector layer in a lower portion of the collector layer; and a third step of forming each of a first-conductive-type base layer and a second-conductive-type emitter layer in a predetermined region of a surface portion of the collector layer.

6 Claims, 8 Drawing Sheets

METHOD FOR FABRICATING BIPOLAR TRANSISTOR

BACKGROUND OF THE INVENTION

The present invention relates to a method for fabricating a bipolar transistor, and more particularly relates to a method for fabricating a bipolar transistor in which epitaxial growth is not used.

In recent years, as the cellular phone market and the mobile equipment market have been expanding, reduction in costs for bipolar transistors as a high-speed operation device has been required. Hereinafter, a known method for fabricating a bipolar transistor will be described with reference to the accompanying drawings.

First, a method for fabricating a bipolar transistor according to a first known example will be described with reference to FIGS. 7A through 7E (see, e.g., Japanese Examined Patent Publication No. 59-50227).

FIGS. 7A through 7E are cross-sectional views illustrating respective steps of a method for fabricating a bipolar transistor according to the first known example.

Figure 7A:
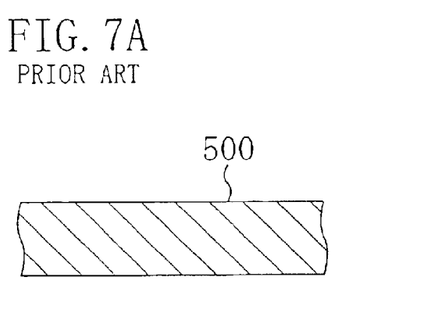
FIGS. 7A through 7E are cross-sectional views illustrating respective steps of a method for fabricating a bipolar transistor according to a first known example.

First, as shown in FIG. 7A, a p-type semiconductor single crystalline substrate 500 made of silicon and doped with boron at a concentration of $1 \times 10^{15}$ atoms/cm$^3$ is prepared.

Figure 7B:
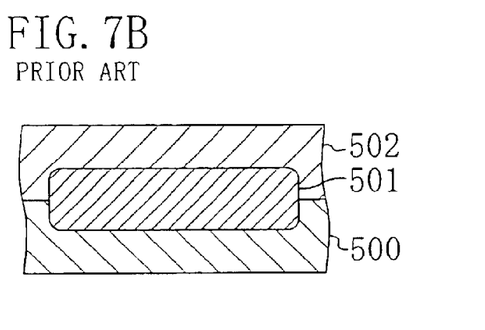

Next, as shown in FIG. 7B, using a mask (not shown) having an opening portion corresponding to a buried-collector-layer-forming region, arsenic ions are implanted into the semiconductor single crystalline substrate 500 at an injection dose of $5 \times 10^{15}$ atoms/cm$^2$. An injection angle in this ion implantation process is slightly tilted (by about 7 degree) from the normal direction of the semiconductor single crystalline substrate 500. By the ion implantation process, a buried collector layer 501 is formed in a predetermined region of the semiconductor single crystalline substrate 500. Thereafter, an epitaxial layer 502 which is doped with phosphorus at a concentration of about $1 \times 1016$ atoms/cm$^3$ and has a thickness of about 1 μm is formed over the semiconductor single crystalline substrate 500. Note that after the epitaxial layer 502 has been formed, arsenic ions introduced into the buried collector layer 501 are diffused in a lower potion of the epitaxial layer 502, so that the buried collector layer 501 expands.

Figure 7C:
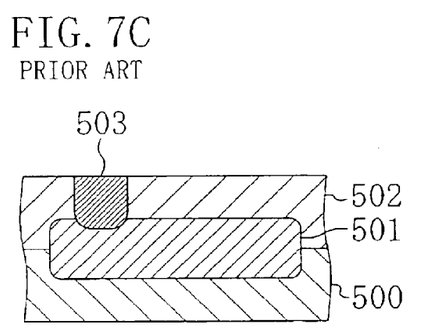

Next, as shown in FIG. 7C, using a mask (not shown) having an opening portion through which a collector-wall-forming region of the epitaxial layer 502 is exposed, phosphorus ions are implanted into the semiconductor single crystalline substrate 500 at an injection dose of $2 \times 10^{15}$ atoms/cm$^2$, thereby forming a collector wall layer 503 in a predetermined region of the epitaxial layer 502. Thereafter, thermal treatment at a temperature of 1000° C. is performed to the semiconductor single crystalline substrate 500 for 30 minutes, thereby expanding the collector wall layer 503 so that the collector wall layer 503 has a thickness enough to reach the buried collector layer 501.

Figure 7D:
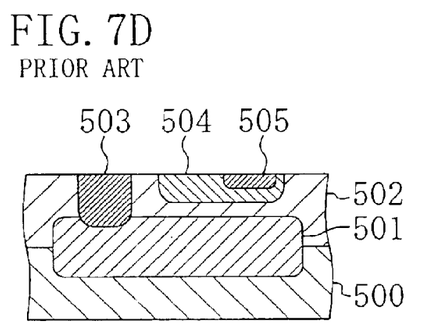

Next, as shown in FIG. 7D, using a mask (not shown) having an opening portion through which a base-layer-forming region of the epitaxial layer 502 is exposed, boron ions are implanted into a surface portion of the epitaxial layer 502 at an injection dose of $3 \times 10^{13}$ atoms/cm$^2$, thereby forming a base layer 504 in a predetermined region of the surface portion of the epitaxial layer 502. Then, using a mask (not shown) having an opening portion through which an emitter-layer-forming region of the base layer 504 is exposed, arsenic ions are implanted into the semiconductor single crystalline substrate 500 at an injection dose of $4 \times 10^{15}$ atoms/cm$^2$, thereby forming an emitter layer 505 in a predetermined region of a surface portion of the base layer 504. Thereafter, thermal treatment at a temperature of 850° C. is performed to the semiconductor single crystalline substrate 500 for about 30 minutes, thereby activating impurities introduced into the base layer 504 and the emitter layer 505, respectively.

Figure 7E:
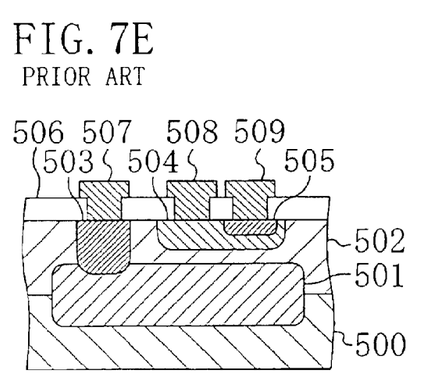

Next, as shown in FIG. 7E, an oxide film 506 made of a BPSG (borophosphosilicate glass) film having a thickness of about 1 μm is deposited over the semiconductor single crystalline substrate 500 using CVD (chemical vapor deposition) to protect a surface of a bipolar transistor including the epitaxial layer 502, the base layer 504, the emitter layer 505 and the like. Thereafter, a collector electrode 507, a base electrode 508 and an emitter electrode 509 (i.e., electrodes of a bipolar transistor) connected to the collector wall layer 503, the base layer 504 and the emitter layer 505, respectively, and made of aluminum are formed by sputtering. Thus, a bipolar transistor is completed. Note that although not shown in FIGS. 7A through 7E, the elemental bipolar transistor described above is surrounded using an appropriate isolation technique, for example, by a dielectric isolation region or a PN junction isolation region, so as to be electrically isolated from other semiconductor elements to be formed in the periphery of the elemental bipolar transistor.

Next, a method for fabricating a bipolar transistor according to a second known example will be described with reference to FIGS. 8A through 8E (see, e.g., Japanese Unexamined Patent Publication No. 2001-291781).

FIGS. 8A through 8E are cross-sectional views illustrating respective steps of a method for fabricating a bipolar transistor according to the second known example. Note that in FIGS. 8A through 8E, the same members as those described in the first known example are identified by the same reference numerals.

Figure 8A:
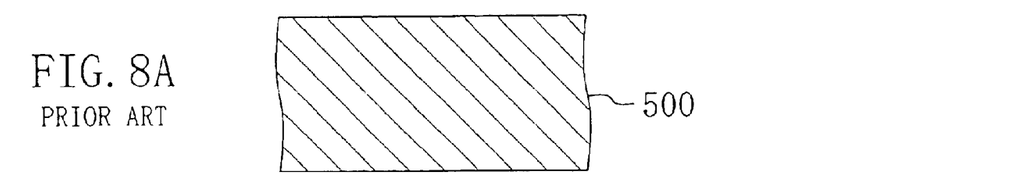
FIGS. 8A through 8E are cross-sectional views illustrating respective steps of a method for fabricating a bipolar transistor according to a second known example.

As shown in FIG. 8A, a p-type semiconductor single crystalline substrate 500 made of silicon and doped with boron at a concentration of $1 \times 10^{15}$ atoms/cm$^3$ is prepared.

Figure 8B:
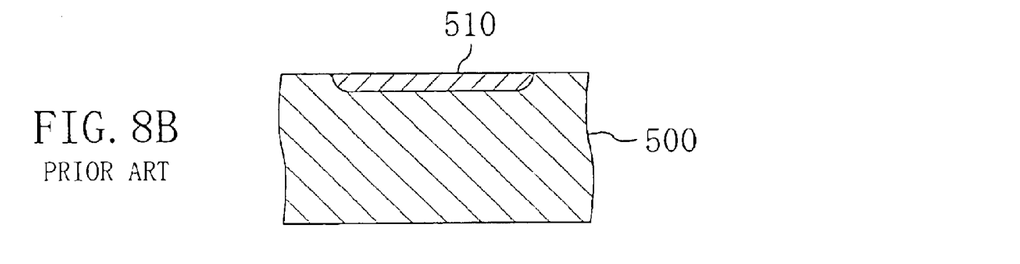

Next, as shown in FIG. 8B, using a mask (not shown) having an opening portion corresponding to a collector-layer-forming region, phosphorus ions are implanted into the semiconductor single crystalline substrate 500 at a dose of $5 \times 10^{12}$ atoms/cm$^2$. An injection angle in this ion implantation process is slightly tilted (by about 7 degree) from the normal direction of the semiconductor single crystalline substrate 500. By this ion implantation process, a collector layer 510 is formed in a predetermined region of the semiconductor single crystalline substrate 500.

Figure 8C:
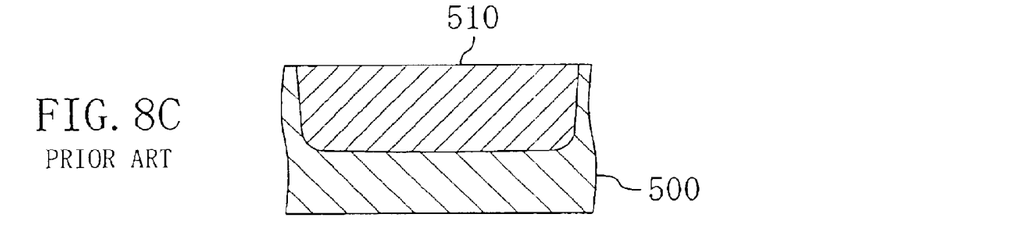

Next, as shown in FIG. 8C, thermal treatment at a temperature of 1100° C. is performed to the semiconductor single crystalline substrate 500 for 100 minutes, thereby activating the collector layer 510 while expanding the collector layer 510 to a predetermined depth.

Figure 8D:
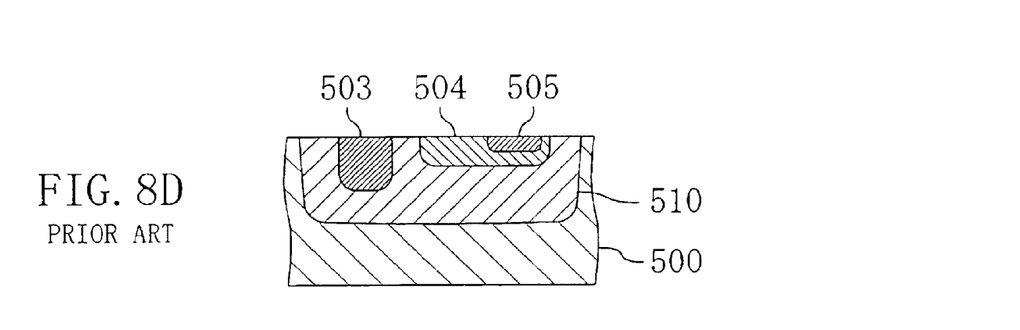
Figure 8E:
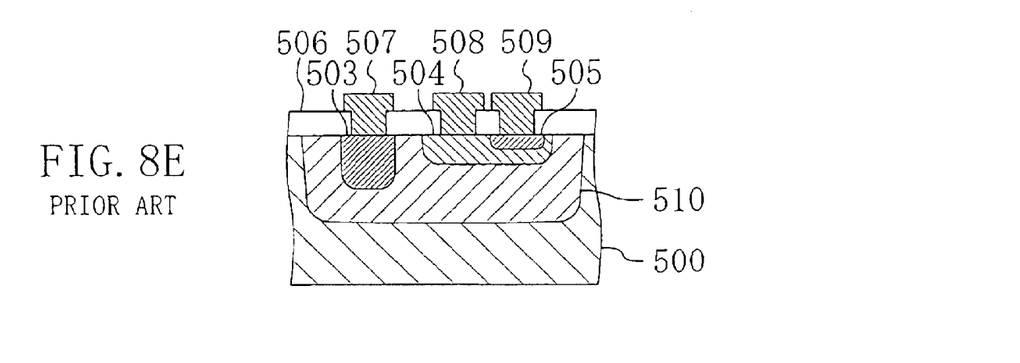

Thereafter, process steps shown in FIGS. 8D and 8E are performed. The process steps are the same as those of FIGS. 7C through 7E used for the first known example.

In the method for fabricating a bipolar transistor according to the first known example, the epitaxial layer 502 is formed. Therefore, fabrication costs are increased. Moreover, because of the existence of the epitaxial layer 502 which is unique to the bipolar transistor, properties of an MOS transistor vary if one or more fabrication process steps for fabricating a bipolar transistor are added to existing CMOS (complementary metal oxide semiconductor) processes.

Moreover, in the second known example, a collector layer 510 is formed using an n-type well, instead of an epitaxial layer. In this case, to ensure the breakdown voltage of a bipolar transistor, the collector layer 510 has to be formed at a great depth in the downward direction from a surface of the semiconductor single crystalline substrate 500. Therefore, drive-in diffusion at a high temperature is normally performed. However, an impurity introduced through ion implantation is diffused not only in the downward direction but also in the lateral direction. Therefore, taking it into consideration that the collector layer 510 (see FIG. 8B) formed on the surface portion of the semiconductor single crystalline substrate 500 through ion implantation expands also in the lateral direction (see FIG. 8C) due to a high temperature drive-in diffusion, a clearance between adjacent collector layers 510 for bipolar transistors has to be increased. Accordingly, a problem arises in which the area of a final device is increased.

By the way, as means for solving the above-described problems, a method in which an impurity doped layer, such as an epitaxial layer, having a uniform impurity profile is formed, i.e., multiple ion implantation (see, e.g., D. H. Lee, J. W. Mayer, "Ion-Implanted Semiconductor Device", *Proceeding of the IEEE*, Vol. 62, No. 9, pp. 1241–1255, USA, 1972) has been known.

However, multiple ion implantation has the following problem.

Figure 9:
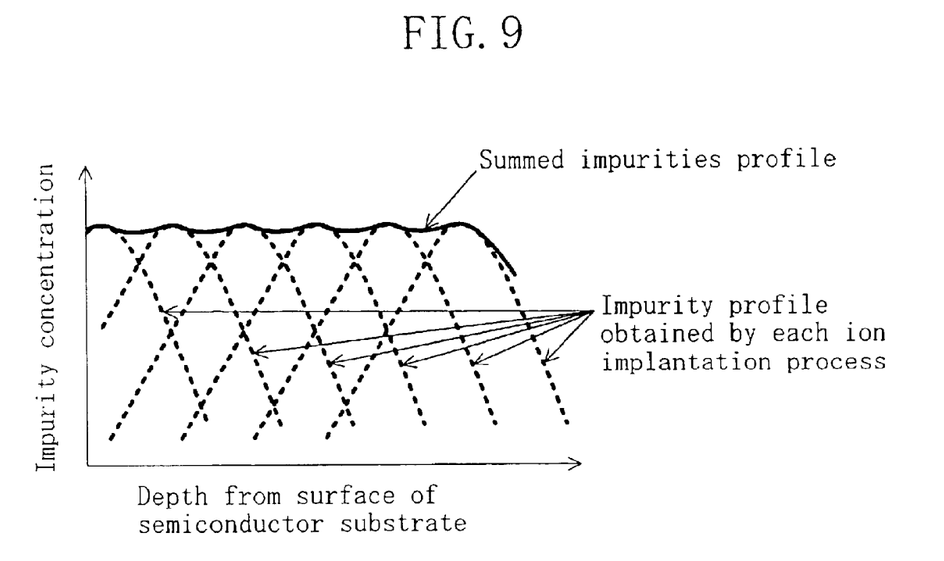
FIG. 9 is a graph showing an impurity profile obtained by multiple ion implantation.

FIG. 9 is a graph showing an impurity profile obtained by multiple ion implantation, and more specifically, the relationship between a depth from a surface of semiconductor single crystalline substrate (hereinafter, referred to as a "substrate surface") which an injected impurity reaches and the concentration of the injected impurity.

As shown in FIG. 9, multiple ion implantation is a method in which while ion implantation processes at different injection energies are repeated to subsequently create impurity profiles with intermittently different peak positions (depth from the substrate surface in FIG. 9) of an impurity concentration, and also these impurity profiles are summed up to obtain an impurity profile having a substantially uniform impurity concentration.

If such multiple ion implantation is used, it is possible to create an impurity profile which corresponds to an epitaxial layer and in which the distribution of the impurity concentration is constant in the semiconductor single crystalline substrate thickness direction. However, in multiple ion implantation, ion implantation with multiple steps has to be performed under different injection conditions (acceleration energy level), and thus the number of ion implantation processes is increased. Accordingly, damages accumulated in a semiconductor single crystalline substrate are increased, causing deterioration of device properties. Moreover, multiple ion implantation has another problem in which because the number of ion implantations is large, processing time is increased, thus resulting in increase in fabrication costs.

SUMMARY OF THE INVENTION

In view of the above-described problems, it is an object of the present invention to allow fabrication of a bipolar transistor without performing an epitaxial growth process while avoiding adverse effects caused by multiple ion implantation.

A method for fabricating a bipolar transistor according to the present invention includes: a first step of implanting, along the normal direction of the principle surface of a first-conductive-type semiconductor single crystalline substrate, ions of a second-conductive-type first impurity into the semiconductor single crystalline substrate to form a second-conductive-type collector layer; a second step of implanting, along a direction tilted from the normal direction, ions of a second-conductive-type second impurity into the semiconductor single crystalline substrate at a higher injection energy than that in the ion implantation of the first step to form a second-conductive-type buried collector layer in a lower portion of the collector layer; and a third step of forming each of a first-conductive-type base layer and a second-conductive-type emitter layer in a predetermined region of a surface portion of the collector layer.

According to the inventive method for fabricating a bipolar transistor, along the normal direction of the principle surface of a first-conductive-type semiconductor single crystalline substrate (hereinafter, referred to as a "substrate surface"), ions of a second-conductive-type first impurity are implanted into the semiconductor single crystalline substrate to form a second-conductive-type collector layer. In this case, atoms (semiconductor atoms) constituting the semiconductor single crystalline substrate array, thereby forming crystalline lattices. Thus, the injected first impurity does not stay in a surface portion of the semiconductor single crystalline substrate (hereinafter, referred to as a "substrate surface portion") but travels in the semiconductor single crystalline substrate. Specifically, the first impurity passes through between crystalline lattices to reach a deeper portion of the substrate than the substrate surface. (This is so called channeling phenomenon. Note that although a current path formed directly under a gate electrode of an MOS device is referred to as a "channel". However, needless to say, this channel has a different concept from that of the channel used in the present application.) As a result, a collector layer having an impurity profile with a constant distribution of the concentration of the first impurity in the thickness direction of the semiconductor single crystalline substrate is formed. Thus, a similar impurity profile to that of a known epitaxial layer can be obtained by a single ion implantation process. Accordingly, accumulation of damages in a semiconductor single crystalline substrate due to ion implantation, which has been a problem of the known multiple ion implantation in which multiple ion implantation processes are separately preformed in different stages can be prevented. Moreover, increase in fabrication costs can be avoided.

In contrast, in the second step of forming a second-conductive-type buried collector layer, ions of a second impurity are implanted into the semiconductor single crystalline substrate along a direction tilted from the normal direction of the substrate surface. Ions of the second impurity implanted by the ion implantation from such a tilted direction tend to collide with semiconductor atoms which regularly array when traveling in the semiconductor single crystalline substrate. Therefore, in the second step, ions of the second impurity are concentratedly implanted at a predetermined depth so that an impurity profile in which a sharp peak of the concentration of the second impurity is located at the predetermined depth from the substrate surface. Furthermore, when the ion implantation of the second impurity is performed at a higher injection energy than that in the ion implantation of the first impurity, ions of the second impurity can be implanted at a deeper position of the substrate than the substrate surface according to an injection energy level. Thus, a buried collector layer having an impurity profile with a sharp concentration peak can be formed in a lower portion of the collector layer. Therefore, a bipolar transistor having a similar impurity profile to that of a known bipolar transistor including a buried collector layer and an epitaxial layer can be fabricated by the ion implantations of the first and second impurities. That is to say, an epitaxial growth process can be omitted from fabrication process steps for fabricating a bipolar transistor.

Moreover, in the known method, a buried collector layer has to be formed before an epitaxial layer is formed. However, according to the present invention, ion implantation is performed at a high injection energy. Thus, even after a collector layer (corresponding to the known epitaxial layer) has been formed, a buried collector layer can be selectively formed in a lower portion of the collector layer.

Moreover, according to the inventive method for fabricating a bipolar transistor, the same mask can be used to form a collector layer and a buried collector layer. Therefore, fabrication costs can be suppressed to a low level.

In the inventive method for fabricating a bipolar transistor, it is preferable that an injection dose in the ion implantation of the second step is 10 times or more as much as that in the ion implantation of the first step, and an injection energy in the ion implantation of the second step is 6 time or more as much as that in the ion implantation of the first step.

Thus, a buried collector layer into which the second-conductive-type second impurity is introduced at a high concentration can be reliably formed in a lower portion of the collector layer. Therefore, it is possible to reliably form a bipolar transistor having a similar impurity profile to that of an epitaxial layer formed through epitaxial growth.

In the inventive method for fabricating a bipolar transistor, it is preferable that the third step includes forming the base layer in a predetermined region of the surface portion of the collector layer, forming, on the semiconductor single crystalline substrate in which the base layer is formed, a mask having a first opening portion through which an emitter-layer-forming region of the base layer is exposed and a second opening portion through which a collector-contact-layer forming region is exposed, and forming, using the mask, the emitter layer in part of the base layer located under the first opening portion simultaneously with a second-conductive-type collector contact layer in part of the collector layer located under the second opening portion.

Thus, a second-conductive-type collector contact layer is formed in a predetermined region of a surface portion of the collector layer. Accordingly, with the collector contact layer connected to the collector electrode, contact resistance generated in a connection portion of the collector layer and the collector electrode can be reduced. Therefore, the current driving ability of the bipolar transistor can be improved. Moreover, a mask for forming the emitter layer is used to form the collector contact layer. Thus, a process step for forming a collector contact layer is not necessarily added. Therefore, it is possible to fabricate a high performance bipolar transistor while achieving cost maintenance.

Furthermore, it is preferable that the collect contact layer is formed so as to surround the base layer.

Thus, a second-conductive-type collector contact layer is formed in a region of the surface portion of the collector layer located between the semiconductor single crystalline substrate and the base layer. That is to say, the collector contact layer is formed so as to surround the base layer. Therefore, the second-conductive-type impurity can be supplied to the region of the surface portion of the collector layer in which the collector layer is formed. In other words, the second-conductive-type collector contact layer can be reliably provided in a region of the surface portion of the collector layer located between the semiconductor single crystalline substrate and the base layer. It is because the channeling phenomenon occurs in the surface portion of the collector layer when ion implantation is performed why the second-conductive-type impurity is supplied in this manner. There may be cases where if the channeling phenomenon occurs, the concentration of the second-conductive-type impurity is reduced in the surface portion. However, when the collector contact layer is formed in the above-described manner, the concentration of the second-conductive-type impurity in the surface portion of the collector layer is reduced. Thus, for example, deterioration of the punch through breakdown voltage between a first-conductive-type semiconductor single crystalline substrate and a first-conductive-type base layer can be prevented. Moreover, inversion of the conductive type of the surface portion of the collector layer due to influence of a voltage applied to an interconnect can be prevented.

It is preferable that the inventive method for fabricating a bipolar transistor further includes between the second and third steps, the step of implanting ions of a second-conductive-type third impurity into the semiconductor single crystalline substrate to form a second-conductive-type inversion preventing layer in the surface portion of the collector layer, an injection dose in the ion implantation of the step of forming an inversion preventing layer is smaller than that in the ion implantation of the first step, and an injection energy in the ion implantation of the step of forming an inversion preventing layer is smaller than that in the ion implantation of the first step.

Thus, ion implantation of the third impurity is performed at a lower injection energy than that of the ion implantation of the first impurity, so that an inversion preventing layer of the same conductive type as that of the collector layer, i.e., the second-conductive-type is formed in the surface portion of the collector layer formed in the semiconductor single crystalline substrate. Accordingly, even if the concentration of the second-conductive-type first impurity in the surface portion of the collector layer is reduced due to the above-described channeling phenomenon caused when ion implantation is performed, it is possible to supply the second-conductive-type third impurity to the surface portion of the collector layer. Therefore, as described above, deterioration of the punch through breakdown voltage due to reduction of the concentration of the first impurity in the surface portion of the collector layer or inversion of the conductive type of the surface portion of the collector layer into the first conductive type can be prevented.

Moreover, a plurality of doped layers (i.e., collector layer, buried collector layer and inversion preventing layer) can be formed using the same mask, so that fabrication costs can be suppressed to a low level and also an inversion layer can be formed without causing any location gap between a region of the substrate surface portion in which a collector layer is to be formed and a region of the substrate surface portion in which an inversion preventing layer is to be formed.

In the inventive method for fabricating a bipolar transistor, it is preferable that after the third step, thermal treatment is performed to the semiconductor single crystalline substrate to activate the collector layer, the buried collector layer, the base layer, and the emitter layer.

Thus, it is sufficient to perform thermal treatment at a low temperature for activating injected impurities, so that high temperature thermal treatment such as thermal treatment required in drive-in diffusion shown in the first and second known examples is not necessary. Therefore, expansion of each of the doped layers in the lateral direction can be prevented, thus suppressing increase in a device area.

BRIEF DESCRIPTION OF THE DRAWINGS

FIGS. 1A through 1E are cross-sectional views illustrating respective steps of a method for fabricating a bipolar transistor according to a first embodiment of the present invention.

DESCRIPTION OF THE PREFERRED EMBODIMENTS (First Embodiment)

Hereinafter, a method for fabricating a bipolar transistor according to a first embodiment of the present invention with reference to the accompanying drawings.

FIGS. 1A through 1E are cross-sectional views illustrating respective steps of the method for fabricating a bipolar transistor according to the first embodiment of the present invention.

Figure 1A:
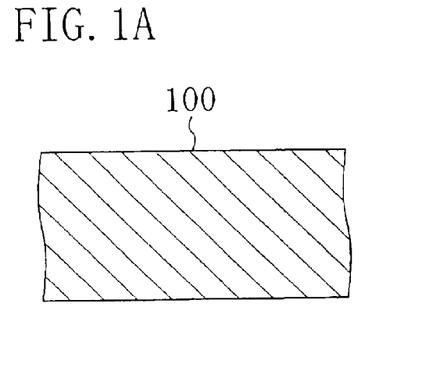

First, as shown in FIG. 1A, a p-type semiconductor single crystalline substrate 100 made of, for example, silicon and doped with, for example, boron at a concentration of $1 \times 10^{15}$ atoms/cm$^3$ is prepared.

Next, as shown in FIG. 1B, a thick resist having a thickness of 2–4 $\mu$m is applied over the semiconductor single crystalline substrate 100. Thereafter, the resist is patterned, thereby forming a first mask having an opening portion corresponding to a collector-layer-forming region of the semiconductor single crystalline substrate 100.

Figure 1C:
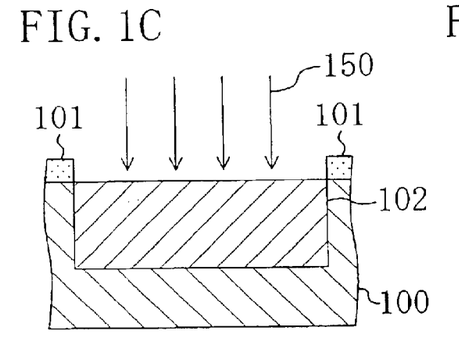

Next, as shown in FIG. 1C, using the first mask 101, ions of an n-type impurity, for example, phosphorus ions are implanted into the semiconductor single crystalline substrate 100 (this process steps will be referred to as a "first ion implantation process 150), thereby forming an n-type collector wall layer 102. The first ion implantation process 150 is performed along the normal direction of the principle surface of the semiconductor single crystalline substrate 100 (hereinafter, referred to as a "substrate surface"), for example, at an injection energy of 150 KeV and at a dose of $1 \times 10^{12}$ atoms/cm$^2$. Channeling of phosphorus ions implanted in the first ion implantation process occurs in a surface portion of the semiconductor single crystalline substrate 100 (hereinafter, referred to as a "substrate surface portion"), so that, for example, an impurity profile in which the impurity concentration is substantially constant at $1 \times 10^{16}$ atoms/cm$^3$ in a region of the substrate extending from the substrate surface to a depth of 1.1$\mu$m can be obtained.

Next, as shown in FIG. 1D, using again the first mask 101 which has been used to form the collector layer 102, ions of an n-type impurity, for example, phosphorus ions are implanted into the semiconductor single crystalline substrate 100 (this process step will be referred to as a second ion implantation process 151), thereby forming an n-type buried collector layer 103 in a lower portion of the collector layer 102. The second ion implantation process 151 is performed along the direction tilted by about 7 degrees from the normal direction of the substrate surface, for example at an injection energy of 1.2 MeV and at an injection dose of $5 \times 10^{13}$ atoms/cm$^2$. Thus, an impurity profile having a concentration peak at a depth of about 1 $\mu$m from a surface of the semiconductor single crystalline substrate 100 (hereinafter, referred to as a "substrate surface") can be obtained.

Figure 1E:
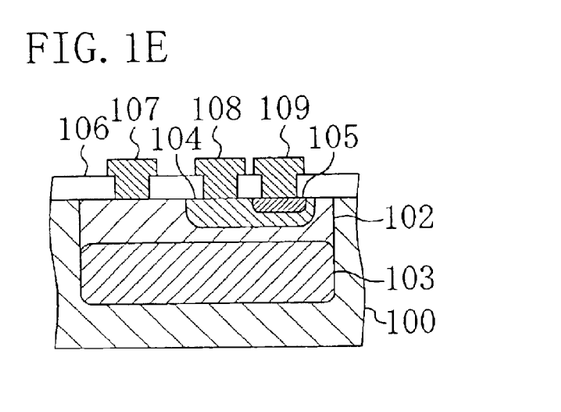

Next, as shown in FIG. 1E, using a mask (not shown) having an opening portion corresponding to a base-layer-forming region of the collector layer 102, ions of a p-type impurity, for example, boron ions are implanted into the semiconductor single crystalline substrate 100 at a dose of $3 \times 10_{10}$ atoms/cm$^2$, thereby forming a p-type base layer 104 in a predetermined region of a surface portion of the collector layer 102. Thereafter, using a mask (not shown) having an opening portion corresponding to an emitter-layer-forming region of the base layer 104, ions of an n-type impurity, for example, arsenic ions are implanted into the semiconductor single crystalline substrate 100 at a dose of $4 \times 10^{15}$ atoms/cm$^2$, thereby forming an n-type emitter layer 105 in a predetermined region of an surface portion of the base layer 104. Thereafter, thermal treatment at a temperature of 850° C. is performed to the semiconductor single crystalline substrate 100 for 30 minutes, thereby activating impurities introduced into the collector layer 102, the buried collector layer 103, the base layer 104 and the emitter layer 105, respectively, at the same time. Thereafter, for example, an oxide film 106 made of a BPSG film and having a thickness of about 1 $\mu$m is deposited over the semiconductor single crystalline substrate 100 by CVD to protect a surface of a bipolar transistor including the collector layer 102, the base layer 104, the emitter layer 105 and the like. Thereafter, a collector electrode 107, a base electrode 108 and an emitter electrode 109 (i.e., electrodes of a bipolar transistor) connected to the collector layer 102, the base layer 104 and the emitter layer 105, respectively, and made of, for example, aluminum are formed by sputtering. In this manner, a bipolar transistor is completed. Note that although not shown in FIGS. 1A through 1E, the bipolar transistor described above is electrically isolated from other semiconductor elements by an appropriate isolation technique, for example, dielectric isolation or PN junction isolation.

Figure 2:
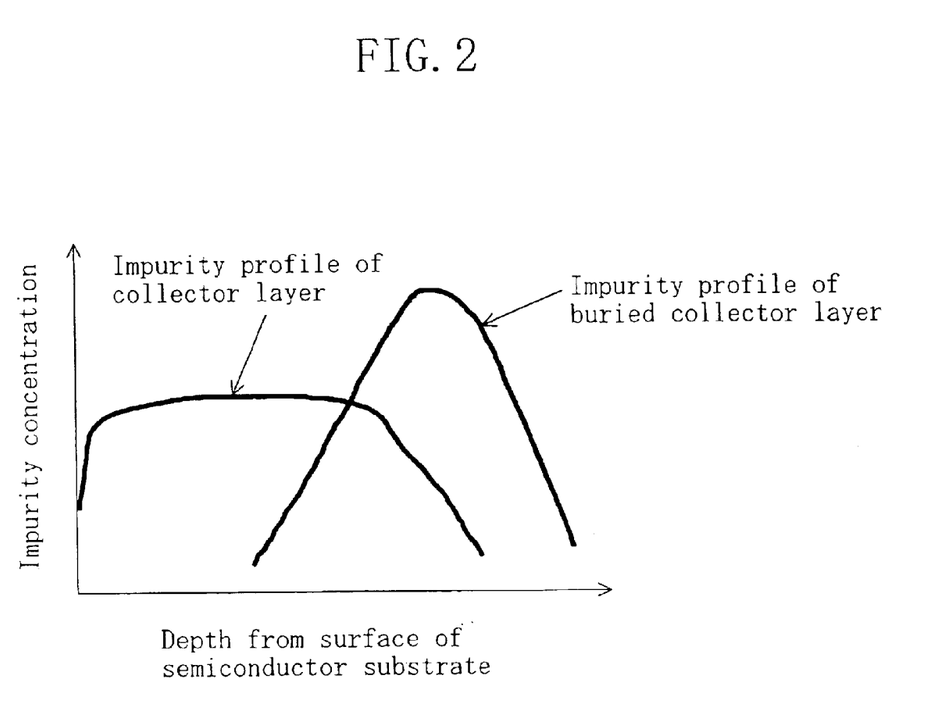
FIG. 2 is a graph showing respective impurity profiles of a collector layer and a buried collector layer formed by the method for fabricating a bipolar transistor according to the first embodiment of the present invention.

The first embodiment is characterized in that the respective ion injection energies and angles are different between the first and second ion implantation processes 150 and 151. FIG. 2 is a graph showing respective impurity profiles of the collector layer 102 and the buried collector layer 103 of FIGS. 1A through 1E, formed by the method for fabricating a bipolar transistor according to this embodiment. More specifically, FIG. 2 is a graph showing the relationship between a depth from a substrate surface, which phosphorus ions reach in the first and second ion implantation processes 150 and 151 and the concentration of phosphorus ions.

As shown in FIG. 2, by the first ion implantation process 150 performed to the semiconductor single crystalline substrate 100 along the normal direction of the substrate surface, channeling of an injected impurity occurs in a substrate surface portion. Accordingly, the collector layer 102 having an impurity profile in which the distribution of the impurity concentration is substantially constant in the thickness direction of the semiconductor single crystalline substrate 100 is formed. In contrast, by the second ion implantation process 151 performed to the semiconductor single crystalline substrate 100 along the direction slightly tilted from the normal direction of the substrate surface, the buried collector layer 103 having an impurity profile with an impurity concentration peak at a predetermined depth is formed. The impurity concentration peak can be made to appear at a deeper position than the predetermined depth by increasing the injection energy of the second ion implantation process 151.

As has been described, according to this embodiment, by the first ion implantation process 150, the collector layer 102 having an impurity profile in which the distribution of the impurity concentration is substantially constant in the thickness direction of the semiconductor single crystalline substrate 100 can be formed. Thus, a similar impurity profile to that of the epitaxial layer of the known example, formed through epitaxial growth, can be obtained by performing only a single ion implantation process. Accordingly, accumulation of damages in the semiconductor single crystalline substrate 100 due to ion implantation, which has been a problem of the known multiple ion implantation including multiple stages for ion implantation can be prevented. Moreover, it is also possible to avoid increase in fabrications costs.

On the other hand, by the second ion implantation process 151, the buried collector layer 103 can be formed so as to have an impurity profile with a sharp impurity concentration peak, and also to be located in a lower portion of the collector layer 102. Therefore, by the first and second ion implantation processes 150 and 151, a bipolar transistor having a similar impurity profile to that of the known bipolar transistor including a buried collector layer and an epitaxial layer can be fabricated. More specifically, an epitaxial growth process can be omitted from a method for fabricating a bipolar transistor.

Moreover, in the known method, a buried collector layer has to be formed before forming an epitaxial layer. However, in this embodiment, even after the collector layer 102 (corresponding to an epitaxial layer in the known method) has been formed, it is possible to selectively form the buried collector layer 103 in a lower portion of the collector layer 102 by performing ion implantation at a high injection energy.

Moreover, according to the first embodiment, the first mask 101 is used for forming both of the collector layer 102 and the buried collector layer 103. Therefore, fabrication costs can be suppressed to a low level.

Moreover, according to the first embodiment, thermal treatment is performed to the semiconductor single crystalline substrate 100 at a low temperature of 850° C. Therefore, phosphorus ions implanted into the collector layer 102 and the buried collector 115 layer 103 are not diffused through drive-in diffusion. More specifically, in the second known example, ion-implanted impurities are diffused not only in the downward direction but also in the lateral direction through drive-in diffusion. However, in the first embodiment, thermal treatment is performed at a low temperature, so that the collector layer 102 and the buried collector layer 103 do not expand in the lateral direction and in the depth direction, respectively. Thus, the original shapes of the collector layer 102 and the buried collector layer 103 obtained when the collector layer 102 and the buried collector layer 103 are formed are maintained substantially as they are. Accordingly, a diffusion length in the lateral direction can be controlled by adjusting the size of the opening portion of the first mask 101 and also a diffusion length in the depth direction can 125 be controlled by adjusting ion implantation conditions (i.e., injection angle and acceleration energy level). Therefore, there is no need to take expansion of layers due to drive-in diffusion into consideration. Thus, when the pn junction of the bipolar transistor shown in FIGS. 1A through 1D is separated from each of other elements, a clearance between the bipolar transistor and each of the other elements, i.e., the width of part of the semiconductor single crystalline substrate 100 located in the isolation region can be reduced to a minimum width. This allows high density arrangement of bipolar transistors, and therefore a high integrated bipolar 1C can be fabricated.

Specifically, according to this embodiment, it is possible to achieve at low costs a method for fabricating a bipolar transistor from which an epitaxial growth process is omitted and which allows high integration while avoiding problems of the known multiple ion implantation.

Note that in the first embodiment, the injection angle in the first ion implantation process 150 is 90 degrees with respect to the substrate surface. However, as long as the injection angle is tilted by about 1.5 degrees or less, and more preferably about 1 degrees or less from 90 degrees with respect to the substrate surface, the injection angle is considered to be in the normal direction with respect to the substrate surface. On the other hand, if the tilt angle with respect to the normal direction in the second ion implantation process 151 is 2 degrees or more, and more preferably not less than 5 degrees and not more than 30 degrees, effects of the second implantation process 151 can be reliably achieved.

Moreover, in the first embodiment, the injection energy and injection dose in each of the first and second ion implantation processes 150 and 151 are preferably set according to properties that a bipolar transistor to be fabricated is required to have. However, the injection energy in the second ion implantation process 151 has to be higher than that in the first ion injection process step 150. Note that in this case, the injection energy in the second ion implantation process 151 is preferably not less than 6 times and not more than 20 times as much as that in the first ion implantation process 150 and the injection dose in the second ion implantation process 151 is preferably 10 times or more as much as that in the first ion implantation process 150.

Moreover, in the first embodiment, injection energy, injection dose and injection angle in each of ion implantation processes for forming the base layer 104 and the emitter layer 105 are preferably set according to the properties that the bipolar transistor to be fabricated is required to have.

Moreover, in the first embodiment, an npn type bipolar transistor is fabricated. However, instead of the npn type bipolar transistor, a pnp type bipolar transistor in which each component has the opposite conductive type to that of the npn type bipolar transistor may be fabricated.

Moreover, in the first embodiment, the collector layer 102 is formed and then the buried collector layer 103 is formed. However, instead of forming the collector layer 102 and the buried collector layer 103 in this order, the buried collector layer 103 and the collector layer 102 may be formed in this order.

Moreover, in the first embodiment, the boron doped semiconductor single crystalline substrate 100 is prepared. However, a semiconductor single crystalline substrate 100 doped with some other p-type impurity may be prepared.

Moreover, in the first embodiment, phosphorus ions are implanted in the first and second ion implantation processes 150 and 151. However, instead of ion implantation of phosphorus ions, ions of some other n-type impurity may be implanted.

Moreover, in the first embodiment, boron is introduced through ion implantation to form the base layer 104. However, instead of boron introduction through ion implantation, some other p-type impurity may be introduced using some other method.

Moreover, in the first embodiment, arsenic is introduced through ion implantation to form the emitter layer 105. However, instead of arsenic introduction through ion implantation, some other n-type impurity may be introduced using some other method.

Moreover, in the first embodiment, the BPSG film is used as an oxide film 106. However, instead of the BPSG film, some other protective film may be used.

Moreover, in the first embodiment, aluminum is used as a material of each of the collector electrode 107, the base electrode 108, and the emitter electrode 109. However, instead of aluminum, some other metal may be used.

(Second Embodiment)

Hereinafter, a method for fabricating a bipolar transistor according to a second embodiment of the present invention will be described with reference to the accompanying drawings.

FIGS. 3A through 3D are cross-sectional views illustrating respective steps of the method for fabricating a bipolar transistor according to the second embodiment. Note that in FIGS. 3A through 3D, the same members as those of a bipolar transistor shown in FIGS. 1A through 1E and formed by the method for fabricating a bipolar transistor according to the first embodiment are identified by the same reference numerals.

Figure 3A:
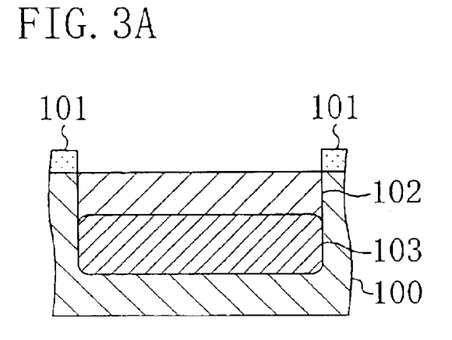
FIGS. 3A through 3D are cross-sectional views illustrating respective steps of a method for fabricating a bipolar transistor according to a second embodiment of the present invention.

As shown in FIG. 3A, the process step of FIG. 3A in the method for fabricating a bipolar transistor according to this embodiment corresponds to the process steps of FIGS. 1A through 1D in the method for fabricating a bipolar transistor according to the first embodiment. By the process step of FIG. 3A, an n-type collector layer 102 and an n-type buried collector layer 103 are formed in predetermined regions of the p-type semiconductor single crystalline substrate 100, respectively.

Figure 3B:
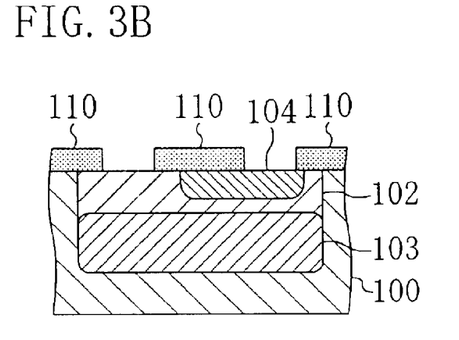

Next, as shown in FIG. 3B, the first mask 101 is removed. Thereafter, using a mask (not shown) having an opening portion corresponding to a base-layer-forming region of the collector layer 102, ions of a p-type impurity, for example, boron ions are implanted into the semiconductor single crystalline substrate 100 at a dose of $3 \times 10^3$ atms/cm$^2$, thereby forming a p-type base layer 104 in a predetermined region of a surface portion of the collector layer 102.

Thereafter, a second mask 110 having a first opening portion through which an emitter-layer-forming region of the base layer 104 is exposed and a second opening portion through which a collector-contact-layer-forming region of the collector layer 102 is exposed is formed.

Figure 3C:
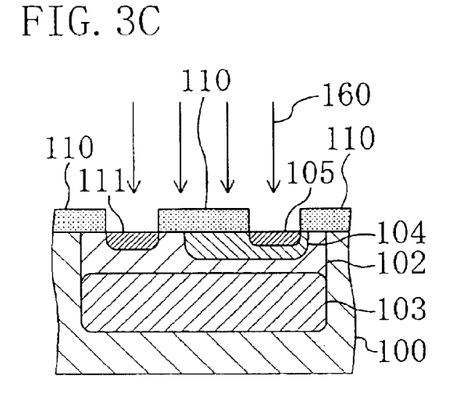

Next, as shown in FIG. 3C, using the second mask 110, ions of an n-type impurity, for example, arsenic ions are implanted into the semiconductor single crystalline substrate 100 (hereinafter, this process step will be referred to as a "third ion implantation process 160"), thereby forming an n-type emitter layer 105 in part of the surface portion of the base layer 104 located under the first opening portion. At the same time, a collector contact layer 111 obtained by introducing an n-type impurity at a high concentration in part of the surface portion of the collector layer 102 located under the second opening portion. The third ion implantation process 160 is performed at an injection energy of 50 KeV and at an injection dose of $5 \times 10^{15}$ atoms/cm$^2$. Thereafter, thermal treatment at a temperature of 85° C. is performed to the semiconductor single crystalline substrate 100 for 30 minutes, thereby activating impurities introduced into the collector layer 102, the buried collector layer 103, the base layer 104, the emitter layer 105 and the collector contact layer 111, respectively.

Figure 3D:
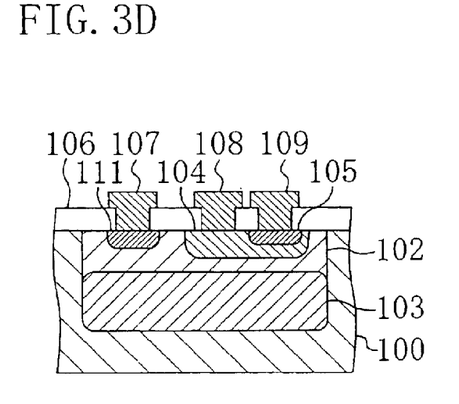

Next, as shown in FIG. 3D, the second mask 110 is removed. Thereafter, for example, an oxide film 106 made of a BPSG film and having a thickness of about 1 $\mu$m is deposited over the semiconductor single crystalline substrate 100 by CVD to protect a surface of a bipolar transistor including the collector layer 102, the base layer 104, the emitter layer 105 and the like. Thereafter, a collector electrode 107, a base electrode 108 and an emitter electrode 109 (i.e., electrodes of a bipolar transistor) connected to the collector layer 102, the base layer 104 and the emitter layer 105, respectively, and made of aluminum are formed by sputtering. In this manner, a bipolar transistor is completed. Moreover, although not shown in FIGS. 3A through 3D, the bipolar transistor described above is electrically isolated from other semiconductor elements by an appropriate isolation technique, for example, dielectric isolation or PN junction isolation.

According to the second embodiment, in addition to the effects which can be achieved by the first embodiment, the following effects can be achieved. In this embodiment, the collector contact layer 111 into which an n-type impurity is introduced at a high concentration is formed in a region of a surface portion of the collector layer 102 in which the collector layer 102 and the collector electrode 107 are in contact with each other. Thus, a contact resistance generated in a contact portion of the collector layer 102 and the collector electrode 107 is reduced. As a result, the current driving ability of an npn bipolar transistor fabricated according to this embodiment can be improved. Moreover, the collector contact layer 111 can be formed using the second mask 110 for forming the emitter layer 105. Therefore, a high performance bipolar transistor can be fabricated while fabrication costs maintenance is achieved.

Note that in the second embodiment, the injection energy, injection dose and injection angle in the third ion implantation process 160 are preferably set according to properties that a bipolar transistor to be fabricated is required to have.

Moreover, in the second embodiment, arsenic is introduced through the third ion implantation process to form the collector contact layer 111. However, instead of arsenic introduction through the third ion implantation process 160, some other n-type impurity may be introduced using some other method.

Moreover, in the second embodiment, an npn type bipolar transistor is fabricated. However, instead of an npn type bipolar transistor, a pnp type bipolar transistor in which each component has the opposite conductive type to that of the npn type bipolar transistor may be fabricated.

(Third Embodiment)

Hereinafter, a method for fabricating a bipolar transistor according to a third embodiment of the present invention will be described with reference to the accompanying drawings.

FIGS. 4A through 4D are cross-sectional views illustrating respective steps of the method for fabricating a bipolar transistor according to the third embodiment of the present invention. Note that the same members as those of a bipolar transistor shown in FIGS. 1A through 1E and formed by the method for fabricating a bipolar transistor according to the first embodiment are identified by the same reference numerals.

Figure 4A:
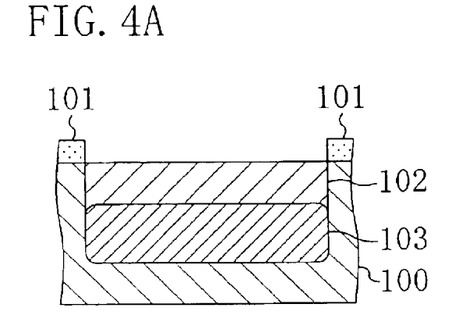
FIGS. 4A through 4D are cross-sectional views illustrating respective steps of a method for fabricating a bipolar transistor according to a third embodiment of the present invention.

As shown in FIG. 4A, the process step of FIG. 4A in the method for fabricating a bipolar transistor according to this embodiment corresponds to the process steps of FIGS. 1A through 1D in the method for fabricating a bipolar transistor according to the first embodiment. By the process step of FIG. 4A, an n-type collector layer 102 and an n-type buried collector layer 103 are formed in predetermined regions of the p-type semiconductor single crystalline substrate 100, respectively.

Figure 4B:
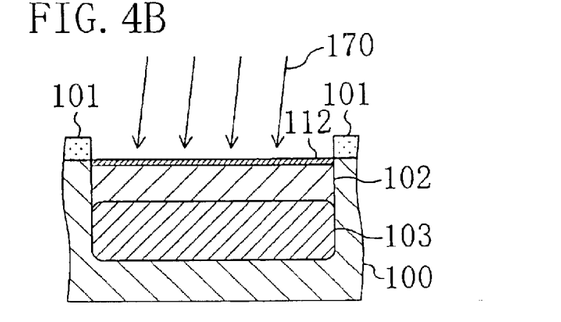

As shown in FIG. 4B, using the first mask 101, ions of an n-type impurity, for example, phosphorus ions are implanted into the semiconductor single crystalline substrate 100 (hereinafter, this process step will be referred to as a "fourth ion implantation process 170), thereby forming an n-type inversion preventing layer 112 in a surface portion of the collector layer 102. The fourth ion implantation process 170 is performed at an injection energy of 30 KeV and at an injection dose of $2 \times 10^{12}$ atms/cm$^2$.

Figure 4C:
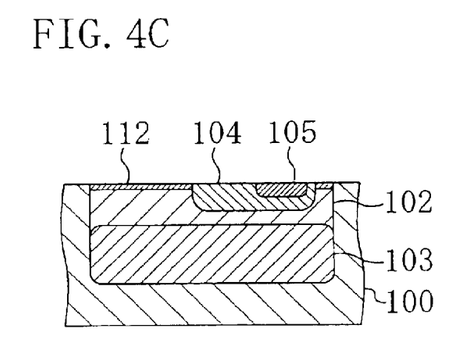

Next, as shown in FIG. 4C, the first mask 101 is removed. Thereafter, using a mask (not shown) having an opening portion corresponding to a base-layer-forming region of the collector layer 102, ions of a p-type impurity, for example, boron ions are implanted into the semiconductor single crystalline substrate 100 at a dose of $3 \times 10^{13}$ atms/cm$^2$, thereby forming a p-type base layer 104 in a predetermined region of the surface portion of the collector layer 102. Thereafter, using a mask (not shown) having an opening portion corresponding to an emitter-layer-forming region of the base layer 104, ions of an n-type impurity, for example, arsenic ions are implanted into the semiconductor single crystalline substrate 100 at a dose of $4 \times 10^{15}$ atms/cm$^2$, thereby forming an n-type emitter layer 105 in a predetermined region of an surface portion of the base layer 104. Thereafter, thermal treatment at a temperature of 850° C. is performed to the semiconductor single crystalline substrate 100 for 30 minutes, thereby activating impurities introduced into the collector layer 102, the buried collector layer 103, the base is layer 104 and the emitter layer 105, respectively.

Figure 4D:
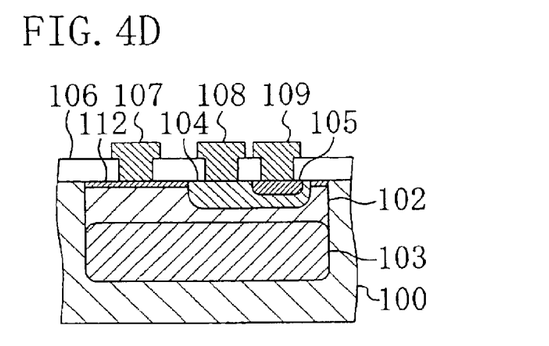

Next, as shown in FIG. 4D, a bipolar transistor is completed by the same process step as that of FIG. 3D in the method for fabricating a bipolar transistor according to the second embodiment.

The third embodiment is characterized in that the fourth ion implantation process 170 is performed at a smaller injection energy and a smaller injection dose than those in the first ion implantation process 150 to form an inversion preventing layer 112 in the surface portion of the collector layer 102.

Figure 5:
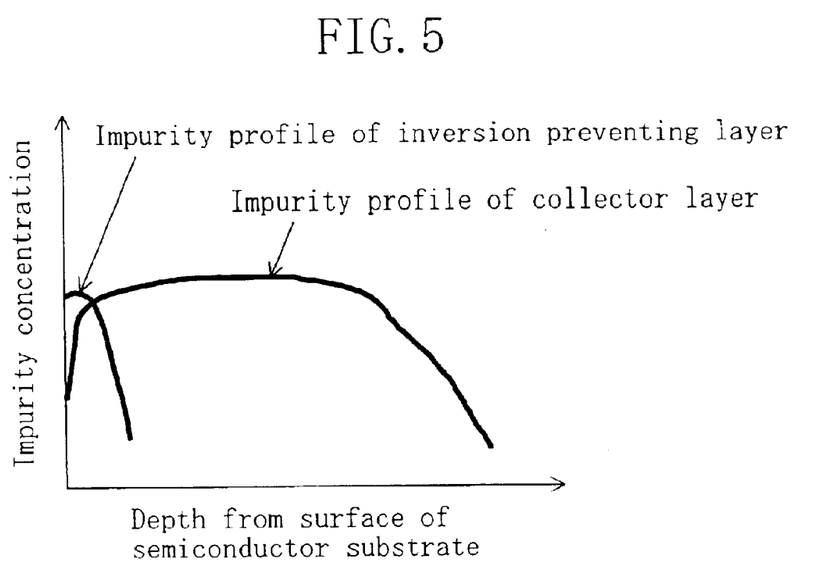
FIG. 5 is a graph showing respective impurity profiles of a collector layer and an inversion preventing layer obtained by the method for fabricating a bipolar transistor according to the third embodiment of the present invention.

FIG. 5 is a graph showing respective impurity profiles of the collector layer 102 obtained by the first ion implantation process 150 and the inversion preventing layer 112 obtained by the fourth ion implantation process 170. As shown in FIG. 5, in the first ion implantation process 150, ions of the n-type impurity (phosphorus ions) are implanted along with the normal direction of the substrate surface. Accordingly, due to the channeling phenomenon caused in performing ion implantation, the n-type impurity passes through between binding lattices of semiconductor atoms such as Si atoms to reach a deeper position than the substrate surface. In this case, the injected n-type impurity hardly stays in the substrate surface portion, resulting in reduction in the concentration of the n-type impurity in the surface portion of the collector layer 102. On the other hand, in the fourth ion implantation process 170 performed at a low injection energy, the concentration of the injected n-type impurity (phosphorus ions) is increased to a high level in the surface portion of the collector layer 102 because the injection energy is low.

Thus, according to the third embodiment, in addition to the effects which can be achieved by the first embodiment, the following effects can be achieved. In this embodiment, the inversion preventing layer 112 is formed in the surface portion of the collector layer 102, so that the n-type impurity can be supplied to the surface portion of the collector layer 102 in which the concentration of the n-type impurity is reduced. As a result, deterioration of the punch-through breakdown voltage between the p-type semiconductor single crystalline substrate 100 and the p-type base layer 104 or inversion of the conductive type of the surface portion of the collector layer 102 into the p-type due to influence of a voltage applied to an aluminum interconnect can be prevented. Therefore, a highly reliable bipolar transistor can be fabricated.

Moreover, according to the third embodiment, the first mask 101 used for forming the collector layer 102 and the buried collector layer 103 is used again for forming the inversion preventing layer 112. Therefore, fabrication costs can be suppressed and also the inversion preventing layer 112 can be formed without causing any location gap between the collector-layer-forming region and the inversion-preventing-layer-forming region in the substrate surface portion.

Note that in the third embodiment, the injection energy, injection dose and injection angle in the fourth ion implantation process 170 are preferably set according to properties that a bipolar transistor to be fabricated is required to have. In this case, however, the injection energy in the fourth ion implantation process 170 is smaller than that in the first ion implantation process 150 and the injection dose in the second ion implantation process 170 is smaller than that in the first ion process step 150.

Moreover, according to the third embodiment, phosphorus ions are implanted as the fourth ion implantation process 170. However, instead of phosphorus ion implantation, ions of some other n-type impurity may be implanted.

Moreover, in the third embodiment, an npn type bipolar transistor is fabricated. However, instead of an npn type bipolar transistor, a pnp type bipolar transistor in which each component has the opposite conductive type to that of the npn type bipolar transistor may be fabricated.

(Fourth Embodiment)

Hereinafter, a method for fabricating a bipolar transistor according to a fourth embodiment of the present invention will be described with reference to the accompanying drawings.

Figure 6:
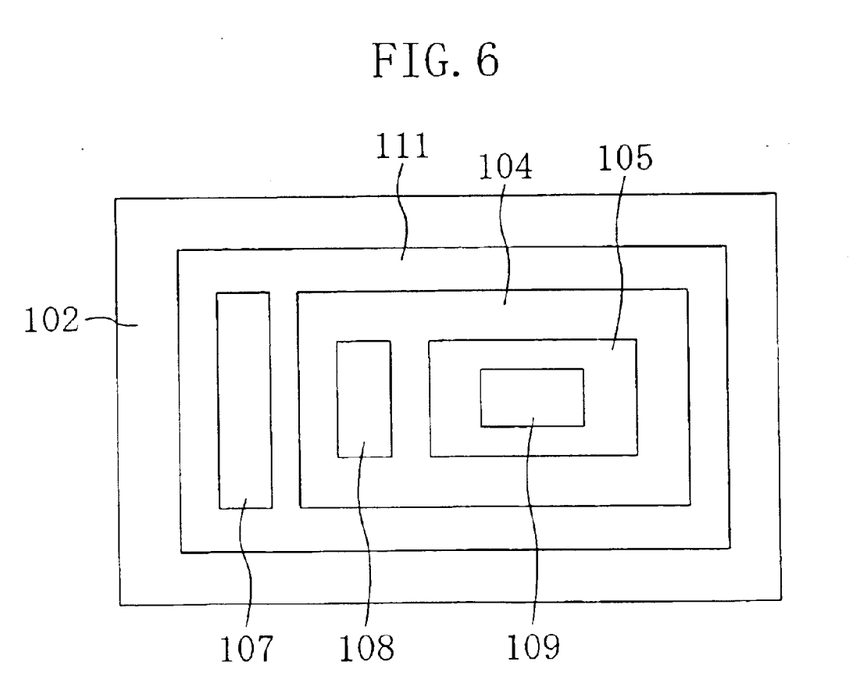
FIG. 6 is a plan view illustrating the structure of a bipolar transistor fabricated by a method for fabricating a bipolar transistor according to a fourth embodiment, and more specifically, is a plan view illustrating the structure of a bipolar transistor formed directly under an oxide film.

FIG. 6 is a plan view illustrating a bipolar transistor fabricated by a method for fabricating a bipolar transistor according to the fourth embodiment. More specifically, FIG. 6 is a plan view illustrating the structure of a bipolar transistor formed directly under the oxide film 106. Note that the same members as those of a bipolar transistor shown in FIGS. 3A through 3D and formed by the method for fabricating a bipolar transistor according to the second embodiment are identified by the same reference numerals.

As shown in FIG. 6, the method for fabricating a bipolar transistor according to the fourth embodiment is characterized in that the collector contact layer 111 is formed so as to surround the base layer 104 by the third ion implantation process 160 of FIG. 3C in the method for fabricating a bipolar transistor according to the second embodiment. Thus, according to the fourth embodiment, in addition to the effects which can be achieved by the second embodiment, the following effects can be achieved.

In this embodiment, as shown in FIG. 6, the collector contact layer 111 is formed so as to surround the base layer 104 in a predetermined region of a surface portion of a collector layer 102. Accordingly, even if the concentration of an n-type impurity (phosphorus ions) in the surface portion of the collector layer 102 is reduced due to the channeling phenomenon caused in performing ion implantation, the n-type impurity (phosphorus ions) can be supplied to the region of the surface portion of the collector layer 102 in which the collector contact layer 111 is to be formed. In other words, the collector contact layer 111 for supplying an n-type impurity is reliably provided in a region of the surface portion of the collector layer 102 located between the p-type semiconductor single crystalline substrate 100 and the base layer 104. Thus, as has been described, by forming the collector contact layer 111 surrounding the base layer 104, deterioration of the punch-through breakdown voltage or inversion of the surface portion of the collector layer 102 into the p-type can be prevented. Therefore, according to this embodiment, a high performance and highly reliable bipolar transistor can be fabricated while an epitaxial growth process is omitted.

Moreover, according to the fourth embodiment, in terms of process steps, only correction of the mask pattern of the second mask 110 used in the second embodiment or the mask pattern of the mask (not shown) used for forming the emitter layer 105 in the first embodiment is required to achieve the fabrication process steps of the fourth embodiment. Therefore, the adverse effect of increase in fabrication costs is not caused.

As has been described, according to the present invention, a collector layer having a similar impurity profile to that of an epitaxial layer formed by a known epitaxial growth process can be obtained by a single ion implantation process. Therefore, accumulation of damages in a semiconductor single crystalline substrate due to ion implantation, which has been a problem of the known multiple ion implantation in which multiple ion implantation processes are separately preformed in different stages, can be prevented. Moreover, increase in fabrication costs can be avoided. Also, a bipolar transistor having a similar impurity profile to that of the known bipolar transistor including a buried collector layer and an epitaxial layer can be fabricated by the first and second impurities ion implantation processes. Therefore, an epitaxial growth process can be omitted from a method for fabricating a bipolar transistor.

What is claimed is:

1. A method for fabricating a bipolar transistor, comprising:

a first step of implanting, along the normal direction of the principle surface of a first-conductive-type semiconductor single crystalline substrate, ions of a second-conductive-type first impurity into the semiconductor single crystalline substrate to form a second-conductive-type collector layer;

a second step of implanting, along a direction tilted from the normal direction, ions of a second-conductive-type second impurity into the semiconductor single crystalline substrate at a higher injection energy than that in the ion implantation of the first step to form a second-conductive-type buried collector layer in a lower portion of the collector layer; and a third step of forming each of a first-conductive-type base layer and a second-conductive-type emitter layer in a predetermined region of a surface portion of the collector layer.

2. The method of claim 1, wherein an injection dose in the ion implantation of the second step is 10 times or more as much as that in the ion implantation of the first step, and wherein an injection energy in the ion implantation of the second step is 6 time or more as much as that in the ion implantation of the first step.

3. The method of claim 1 or 2, wherein the third step includes forming the base layer in a predetermined region of the surface portion of the collector layer, forming, on the semiconductor single crystalline substrate in which the base layer is formed, a mask having a first opening portion through which an emitter-layer-forming region of the base layer is exposed and a second opening portion through which a collector-contact-layer forming region is exposed, and forming, using the mask, the emitter layer in part of the base layer located under the first opening portion simultaneously with a second-conductive-type collector contact layer in part of the collector layer located under the second opening portion.

4. The method of claim 3, wherein the collect contact layer is formed so as to surround the base layer.

5. The method of claim 1 or 2, wherein the method further includes between the second and third steps, the step of implanting ions of a second-conductive-type third impurity into the semiconductor single crystalline substrate to form a second-conductive-type inversion preventing layer in the surface portion of the collector layer, wherein an injection dose in the ion implantation of the step of forming an inversion preventing layer is smaller than that in the ion implantation of the first step, and wherein an injection energy in the ion implantation of the step of forming an inversion preventing layer is smaller than that in the ion implantation of the first step.

6. The method of claim 1 or 2, wherein after the third step, thermal treatment is performed to the semiconductor single crystalline substrate to activate the collector layer, the buried collector layer, the base layer, and the emitter layer.

* * * * *